United States Patent [19]
Woehl et al.

[11] Patent Number: 5,905,313
[45] Date of Patent: May 18, 1999

[54] ELECTRICAL SYSTEM USABLE FOR CAR RADIO AND CD CHANGER

[75] Inventors: Wilhelm Woehl, Hildesheim; Dieter Baas, Rheinau, both of Germany

[73] Assignee: Robert Bosch GmbH, Stuttgart, Germany

[21] Appl. No.: 08/887,741

[22] Filed: Jul. 3, 1997

[30] Foreign Application Priority Data

Jul. 6, 1996 [DE] Germany .................... 196 27 384

[51] Int. Cl.$^6$ .................................................. B60L 1/00
[52] U.S. Cl. .................................. 307/10.1; 340/825.24; 701/36
[58] Field of Search ...................... 307/9.1, 10.1; 340/825.24, 825.25; 701/36, 49; 320/112, 113

[56] References Cited

PUBLICATIONS

Blaupunkt, User manual for ACM 5450 "operating instructions" with translation.

*Primary Examiner*—Jeffrey Gaffin
*Assistant Examiner*—Jonathan S. Kaplan
*Attorney, Agent, or Firm*—Fulbright & Jaworski, LLP

[57] ABSTRACT

An electrical device (1), especially a CD changer, is proposed, which offers protection against theft. An electrical device (1) is connected by a connecting cable (35) to a second electrical device (5), especially to a car radio. The connection has a first pole (95) for a first reference potential (15) and a second pole (100) for a second reference potential (25). In the second electrical device (5), the first reference potential (15) is connected to the second reference potential (25). A third pole (55) contains a supply voltage feed for the first electrical device (1). In the first electrical device (1), a control unit (40) is provided for controlling the first electrical device (1). When the connection between the first and second poles (95, 100) is cut, the residual charge remaining in the first electrical device (1) produces a voltage difference between these two poles (95, 100), as a result of which a security procedure is initiated in control unit (40).

14 Claims, 1 Drawing Sheet

5,905,313

ELECTRICAL SYSTEM USABLE FOR CAR RADIO AND CD CHANGER

BACKGROUND OF THE INVENTION

The invention is based on an electrical system particularly a system for electrical devices in a car.

1. Description of the Prior Art

A car radio in which the disconnection of the operation voltage activates an antitheft device is already known from the user's manual of the Blaupunkt car radio ACM 5450.

2. Advantages of the Invention

The electrical device according to the invention with the features of the main claim offers the advantages that, by uncomplicated means and in a defined time and manner, it is ensured that a code is activated rapidly and reliably after a voltage interruption even while the electrical device is still being removed.

On the basis of the features presented in the subclaims, advantageous further embodiments of, and improvements to, the electrical device specified in the main claim are possible.

Advantageous use can be made of the residual charge remaining in any case in the first electrical device. In this way, there is no need for any significant amount of extra effort to produce the voltage difference.

Advantageous to use a voltage divider, a diode, and a switch to bring about the defined initiation of the security procedure in the control unit. A simple and uncomplicated security circuit is realized, which is also very low in cost.

Advantageous to insert a second capacitor between the control input of the switch and the first reference potential, the capacitance of the second capacitor being smaller than the capacitance of the first capacitor. As a result, brief voltage interruptions, inductive interference, and voltage peaks are prevented from actuating the switch and thus from activating the security procedure in the control unit. It is thus ensured as far as possible that the security procedure will be activated in the control unit only when the voltage is interrupted during a theft.

It is advantageous that, after a voltage interruption, the power supplied to the control unit comes from the residual charge of the first capacitor. As a result, the control unit is still supplied with energy even after the voltage has been interrupted by a theft, which means in turn that the security procedure can still be activated.

It is advantageous that the security procedure is activated after a certain delay, which can be selected by means of a timer acting in concert with the control unit. This again prevents a brief voltage interruption attributable to a disturbance from activating the security procedure in the control unit.

It is advantageous that the electronic lock can be deactivated by entering a code word on a user input component of the first electrical device, the input component being connected to the control unit. As a result, in the event that a voltage interruption, possibly undesired, has led to the activation of the security procedure in the control unit, the user can easily restore the functional status of the electrical device after the voltage supply has been restored.

It is advantageous for the supply voltage or a variable which can be derived from the supply voltage to be measured in the first electrical device, for the measurement result to be sent to the control unit, and for an additional condition to be imposed for the activation of the security procedure in the control unit, namely, that the measured supply voltage or the variable derived from it must fall below a predetermined value in the first electrical device. This provides additional improvement to the protection of the security circuit against unintentional activation of the security procedure.

It is advantageous that it is possible to connect a resistor in parallel to the third capacitor, at which at least a portion of the supply voltage is present, so that the third capacitor can be discharged rapidly when the supply voltage is cut off. In this way, the goal is achieved that the corresponding portion of the supply voltage falls more rapidly than the operating voltage. After the control unit has detected that the corresponding portion of the supply voltage has dropped below the predetermined value, therefore, it still has enough time to activate the security procedure. Leakage currents during the time that the supply voltage is connected can be avoided by connecting the resistor only when the supply voltage is cut off.

DRAWING

An exemplary embodiment of the invention is illustrated in the drawing and explained in greater detail in the following description. FIG. 1 shows a first electrical device connected by way of a connecting cable to a second electrical device and the components housed in the first electrical device required to activate the antitheft protection for the first electrical device.

DESCRIPTION OF THE EXEMPLARY EMBODIMENT

Figure 1:
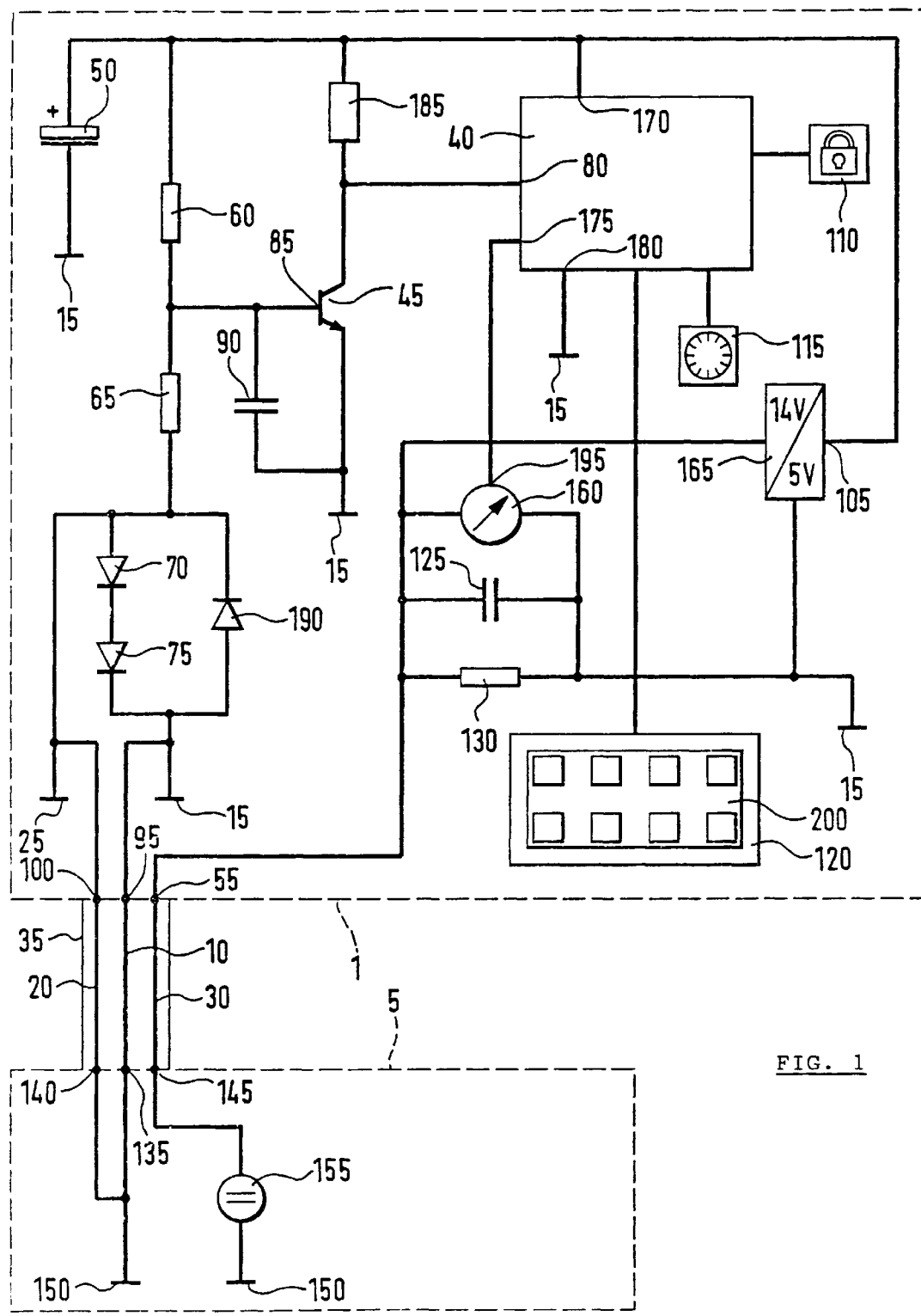

In FIG. 1, 1 designates a first electrical device in the form of a CD changer, which is connected by a cable 35 to a second electrical device 5 in the form of a car radio. The designs of first electrical device I as a CD changer and of second electrical device 5 as a car radio are selected only by way of example for the description of the invention. Any other desired electrical devices can also be equipped in accordance with the invention; for example, first electrical device 1 can also be a video recorder or a car radio, which are operated from a second electrical device 5 designed as a voltage supply unit.

In any case, first electrical device 1 according to the invention as shown in the figure has a first pole 95 for a first reference potential 15 for digital signal processing and a second pole 100 for a second reference potential 25 for analog signal processing. First pole 95 of first electrical device 1 is connected by a first line 10, which passes through connecting cable 35, to a first pole 135 of second electrical device 5, and second pole 100 of first electrical device 1 is connected by way of a second line 20, which also passes through connecting cable 35, to a second pole 140 of second electrical device 5. In second electrical device 5, first pole 135 and second pole 140 are connected to each other and to a third reference potential 150. An electrical device 5 and a third reference potential 150. Third pole 145 of second electrical device 5 is connected by way of a voltage supply line 30 to a third pole 55 of first electrical device 1. D.C. voltage source 155 supplies, for example, a voltage of 14 V. Third pole 55 is connected by way of a multiplier resistor 130 to first reference potential 15. A third capacitor 125 is connected in parallel to multiplier resistor 130. A voltmeter 160 is also connected in parallel to multiplier resistor 130. A measuring output 195 of voltmeter 160 is connected to a voltage-measuring input 175 of a control unit 40. A voltage transformer 165 is also connected to third pole 55 of first electrical device 1. This transformer converts the supply voltage of 14 V used in the example selected here to an operating voltage of 5 V and has an operating voltage output 105, at which the operating potential is available. Voltage transformer 165 is also connected to first reference potential 15. Operating voltage output 105 of voltage transformer 165 is connected to an operating voltage input 170 of control unit 40. Between operating voltage output 105 of voltage transformer 165 and first reference potential 15, a first capacitor 50 is inserted, which can be designed as, for example, an electrolytic capacitor, the positive electrode of this capacitor being connected to operating voltage output 105 of voltage transformer 165. Control unit 40 is connected to a timer 115 and to an electronic lock 110; timer 115 and/or electronic lock 110 can also be integrated into control unit 40. A user input component 120, which can have, for example, a keypad 200, is also connected to control unit 40. Operating voltage output 105 of voltage transformer 165 is connected by way of a first voltage divider resistor 60 and a second voltage divider resistor 65 to the anode of a first diode 70, the cathode of which is connected to the anode of a second diode 75, the cathode of which is connected in turn to first reference potential 15. The cathode of second diode 75 is also connected to the anode of a third diode 190, the cathode of which is connected to the anode of first diode 70. The anode of first diode 70 is also connected to second reference potential 25. The control electrode 85 of a controlled switch 45, designed as an npn-bipolar transistor, is connected between the first and second voltage divider resistors 60, 65; the emitter of the transistor is connected to first reference potential 15 and its collector by way of a collector resistor 185 to operating voltage output 105 of voltage transformer 165. In place of controlled switch 45, it is also possible to use a different sensor, such as, for example, an analog-digital converter. Between control electrode 85 of npn-bipolar transistor 45 and first reference potential 15, a second capacitor 90 is inserted. The collector of npn-bipolar transistor 45 is also connected to a safe input 80 of control unit 40. Control unit 40 has a reference potential output 180, by way of which it is connected to first reference potential 15.

Only the components required for the function of the invention are shown in the two electrical devices 1, 5. First capacitor 50 summarizes all the capacitances in first electrical device 1 connected to operating voltage output 105, and third capacitor 125 summarizes all the capacitances in electrical device 1 connected to the supply voltage potential or to third pole 55 of first electrical device 1.

The invention works in the following way: Because the potentials at first and second poles 95, 100 of first electrical device 1 are the same, there is no voltage drop at first and second diodes 70, 75, which means that the two diodes are in the blocking state. When a second voltage divider resistor 65 with a rating of, for example, 1 kΩ, is chosen, which is relatively low in comparison with that of first voltage divider resistor 60 with a relatively high rating of, for example, 47 kΩ, the control voltage of npn- bipolar transistor 45, at an operating voltage of 5 V, is insufficient to make npn-bipolar transistor 45 conductive, with the result that a safe input 80 of control unit 40 is at HIGH. As long as first electrical device 1 is connected to second electrical device 5 in the manner described, first and second reference potentials 15, 25 are the same, because they are connected in second electrical device 5 to a third, common reference potential 150.

When connecting cable 35 is cut during the course of, for example, a theft, first and second lines 10, 20 are also cut, which means that first and second poles 95, 100 are no longer connected to each other. As a result, a voltage difference occurs between first pole 95 and second pole 100, this difference being limited by first and second diodes 70, 75. Because, when connecting cable 35 is cut, supply voltage line 30 is also cut, first electrical device 1 is cut off from the voltage supply. Therefore, the voltage difference between first and second poles 95, 100 is the result of the residual charge remaining in first electrical device 1, which, according to the figure, is to be understood as the charge of first capacitor 50. The voltage difference between first pole 95 and second pole 100 is therefore determined by the residual charge of first capacitor 50, and first and second diodes 70, 75 are made conductive in the forward direction. As a result of the voltage drop at first and second diodes 70, 75, the control voltage at control electrode 85 of npn-bipolar transistor 45 increases to such an extent that npn-bipolar transistor 45 is closed, and safe input 80 of control unit 40 changes to LOW. After supply voltage line 30 is cut, the residual charge of first capacitor 50 also takes over the job of supplying energy to control unit 40. As soon as npn-bipolar transistor 45 becomes conductive, timer 115 is started by the control unit. In addition, the voltage value at multiplier resistor 130 measured by voltmeter 160 is compared in control unit 40 with a predetermined voltage value. If the measured voltage is below the predetermined value at the point the predetermined time has expired in timer 115, a security procedure is activated in control unit 40, which activates electronic lock 110 by setting, for example, a so-called "theft bit". When the voltage supply is restored, electronic lock 110 can be unlocked only by the entry of a code word on keypad 200 of user input component 120 to set back the theft bit. First electrical device 1 is then ready to operate again, and first and second reference potentials 15, 25 are again the same, so that npn-bipolar transistor 45 is opened again, and safe input 80 of control unit 40 is back in the HIGH position.

Because, after connecting cable 35 has been cut, voltage is supplied to control unit 40 by the charge remaining in first capacitor 50, third capacitor 125 must be discharged more quickly than first capacitor 50, so that the security procedure can be started at all. Multiplier resistor 130 makes sure that third capacitor 125 is discharged with appropriate speed; a low impedance should therefore be selected for this resistor. The time until activation of the security procedure which can be preselected by timer 115 serves to prevent the unwanted activation of the antitheft protection in the case of brief voltage interruptions not the result of the cutting of connecting cable 35 and thus not attributable to theft. The same also applies to the comparison of the measured voltage value with the predetermined value in control unit 40, because brief voltage interruptions not attributable to the cutting of cable 35 do not cause a pronounced drop in the supply voltage and should not be allowed to lead to the activation of the antitheft protection. Multiplier resistor 130 thus ensures that the residual charge in third capacitor 125 decreases with appropriate speed when connecting cable 35 is cut, so that a theft can be detected as quickly as possible and so that the thief is not given the opportunity to connect a substitute voltage source. The time which is set by means of timer 115 must be properly coordinated with the time constant for the decrease of the supply voltage established by the capacitance of third capacitor 125 and multiplier resistor 130. Second capacitor 90 prevents npn-bipolar transistor 45 from becoming conductive during brief voltage interruptions, inductive interference, or peaks on lines 10, 20, 30 in connecting cable 35 (possibly as long as 6 m, for example), which would activate the security procedure in control unit 40. For this purpose, the capacitance of second capacitor 90 must be sufficiently large. At the same time, it must be smaller than the capacitance of first capacitor 50, so that the voltage disparity between first pole 95 and second pole 100 of first electrical device 1 at control input 85 of npn-bipolar transistor 45 has the chance to exert its effect. At a capacitance of 47 nF of second capacitor 90, a capacitance on the order of 220 $\mu$F of first capacitor 50 is sufficient to make npn-bipolar transistor 45 conductive and to activate the security procedure when connecting cable 35 is cut.

As long as connecting cable 35 is still in one piece, first, second, and third diodes 70, 75, 190 ensure that voltage differences between first and second poles 95, 100 of first electrical device 1 caused by voltage interruptions remain limited and thus no circuits are damaged.

In another exemplary embodiment, multiplier resistor 130 can be designed to be switchable, so that it is connected in parallel to third capacitor 125 only after the supply voltage is cut off. This has the effect of avoiding unnecessary power losses. The resistor is thus activated as soon as the sensor switches on, this being effected by control unit 40, acting by way of, for example, a suitable relay. In addition, it is also possible to use a variable derived from the supply voltage instead of the supply voltage itself as the measurement variable. For this purpose, for example, it is possible to divide the supply voltage by an additional voltage divider or to use a current intensity value, etc. proportional to the supply voltage. Thus, the supply voltage divided by the additional voltage divider can also be present at third capacitor 125.

We claim:

1. An electrical device system comprising:

a first electrical device having a connection;

a connecting line having one end connected with the connection of said first electrical device;

a second electrical device connected with the connecting line;

said connection having a first pole providing a first reference potential; and a second pole providing a second reference potential;

wherein said first and second reference potentials is connected with each other via a connecting line in said second electrical device; and said connecting line has a third pole having a voltage supply line feed for the first electrical device;

the first electrical device has a control unit controlling the first electrical device;

wherein a voltage difference is produced between the first and second poles when the connection there between is broken; and whereby a security procedure is initiated in the control unit responsive to detection of said voltage difference.

2. An electrical system according to claim 1, wherein the voltage difference between the first and second poles is produced by the residual charge remaining in the first electrical device.

3. An electrical according to claim 1, wherein a first capacitor is connected to an operating voltage potential derived from the power supply voltage and also to the first reference potential;

wherein the operating voltage is connected by way of a voltage divider to the second reference potential;

a second reference potential is connected by way of a diode in the forward direction to the first reference potential;

the voltage divider producing the control voltage of a sensor as a function of the operating voltage; and the sensor is inserted between the input of the control unit and the first reference potential and causing the initiation of the security procedure.

4. An electrical system according to claim 3, wherein a second capacitor, the capacitance of which is smaller than the capacitance of the first capacitor, is inserted between the control electrode of the sensor and the first reference potential.

5. An electrical system according to claim 4, wherein at least a portion of the supply voltage is applied to a third capacitor, to which a resistor can be connected in parallel for the rapid discharging of the third capacitor upon disconnection of the supply voltage.

6. An electrical system according to claim 3, wherein the operating voltage is sent to the control unit, and, when the connection between the first and second poles is cut, the voltage supply to the control unit is provided by the residual charge of the first capacitor.

7. An electrical system according to claim 3, wherein the voltage difference between the first and second poles which occurs when the connection between the first and second poles is cut changes the control voltage of the sensor in such a way that a switching process occurs and initiates the security procedure in the control unit.

8. An electrical system according to claim 3, wherein said sensor functions as a switch.

9. An electrical system according to claim 1, wherein the first electrical device has an electronic lock which works together with the control unit, the electronic lock being actuated during the security procedure.

10. An electrical system according to claim 9, wherein the electronic lock can be unlocked by the entry of a code word on a user input component of the first electrical device, said component being connected to the control unit.

11. An electrical system according to claim 1, wherein the security procedure is activated after a delay which can be preselected by a timer working together with the control unit.

12. An electrical system according to claim 1, wherein the supply voltage or a variable derived from it is measured in the first electrical device:

the result of said measurement being sent to the control unit; and wherein, to activate the security procedure in the control unit, the measured supply voltage or the variable derived from it in the first electrical device must also fall below a predetermined value.

13. An electrical system according to claim 1, wherein the first reference potential is provided for digital signal processing and the second reference potential for analog signal processing.

14. An electrical system according to claim 1, wherein the first electrical device comprises a CD changer, and the second electrical device comprises a radio for a vehicle.

* * * * *